(12) United States Patent
Kim

(10) Patent No.: US 12,446,229 B2
(45) Date of Patent: Oct. 14, 2025

(54) SEMICONDUCTOR DEVICE INCLUDING FERROELECTRIC LAYER

(71) Applicant: SK hynix Inc., Icheon-si (KR)

(72) Inventor: Joong Sik Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 433 days.

(21) Appl. No.: 18/063,938

(22) Filed: Dec. 9, 2022

(65) Prior Publication Data

US 2024/0008284 A1 Jan. 4, 2024

(30) Foreign Application Priority Data

Jul. 1, 2022 (KR) .......................... 10-2022-0081527

(51) Int. Cl.
*H10B 51/30* (2023.01)
*H10B 51/20* (2023.01)

(52) U.S. Cl.
CPC ............ *H10B 51/30* (2023.02); *H10B 51/20* (2023.02)

(58) Field of Classification Search
CPC ................................ H10B 51/30; H10B 51/20
See application file for complete search history.

(56) References Cited

U.S. PATENT DOCUMENTS

| | | |
|---|---|---|
| 2020/0234751 A1 | 7/2020 | Ramaswamy et al. |
| 2022/0189972 A1* | 6/2022 | Lee ..................... H10D 64/693 |
| 2024/0032303 A1* | 1/2024 | Woo ....................... H10B 51/20 |
| 2024/0099015 A1* | 3/2024 | Lee ..................... H10D 64/689 |

FOREIGN PATENT DOCUMENTS

KR    1020220085646 A    6/2022

* cited by examiner

*Primary Examiner* — Richard A Booth

(57) ABSTRACT

A semiconductor device according to an embodiment includes a substrate, a bit line and a source line extending in a vertical direction substantially perpendicular to a surface of the substrate, a semiconductor layer disposed between the source line and the bit line on a plane substantially parallel to the surface of the substrate, a non-ferroelectric layer pattern disposed on the semiconductor layer, a floating electrode layer pattern disposed on the non-ferroelectric layer pattern, a ferroelectric layer pattern disposed on the floating electrode layer pattern, and a word line disposed on the ferroelectric layer pattern. An overlap area between the floating electrode layer pattern and the non-ferroelectric layer pattern in the vertical direction is greater than an overlap area between the ferroelectric layer pattern and the word line in the vertical direction.

25 Claims, 19 Drawing Sheets

SEMICONDUCTOR DEVICE INCLUDING FERROELECTRIC LAYER

CROSS-REFERENCE TO RELATED APPLICATIONS

The present application claims priority under 35 U.S.C. § 119(a) to Korean Application No. 10-2022-0081527, filed on Jul. 1, 2022, which is incorporated herein by reference in its entirety.

BACKGROUND

1. Technical Field

The present disclosure generally relates to a semiconductor device and, more particularly, to a semiconductor device including a ferroelectric layer.

2. Related Art

In general, a ferroelectric material refers to a material having spontaneous electrical polarization in a state where no external electric field is applied. In addition, the electrical polarization may exhibit a hysteresis behavior when an external electric field is applied. Accordingly, if the external electric field applied to the ferroelectric material is controlled, polarizations having various magnitudes and orientations according to the hysteresis behavior may be reversibly implemented in the ferroelectric material.

Meanwhile, the polarization is non-volatilely stored in the ferroelectric material after the external electric field is removed, so that the ferroelectric material may function as a memory layer of a semiconductor device that stores the polarization as signal information.

SUMMARY

A semiconductor device according to an embodiment of the present disclosure may include a substrate, a bit line and a source line extending in a vertical direction that is substantially perpendicular to a surface of the substrate, a semiconductor layer disposed between the source line and the bit line on a plane that is substantially parallel to the surface of the substrate, a non-ferroelectric layer pattern disposed on the semiconductor layer, a floating electrode layer pattern disposed on the non-ferroelectric layer pattern, a ferroelectric layer pattern disposed on the floating electrode layer pattern, and a word line disposed on the ferroelectric layer pattern. The overlap area between the floating electrode layer pattern and the non-ferroelectric layer pattern in the vertical direction is greater than the overlap area between the ferroelectric layer pattern and the word line in the vertical direction.

A semiconductor device according to another embodiment of the present disclosure may include a substrate, a bit line and a source line extending in a vertical direction that is substantially perpendicular to a surface of the substrate, and a plurality of unit cell structures electrically connected to the bit line and the source line. Each of the plurality of unit cell structures includes a semiconductor layer disposed on a plane that is substantially parallel to the surface of the substrate, a non-ferroelectric layer pattern disposed on the semiconductor layer, a floating electrode layer pattern disposed on the non-ferroelectric layer pattern, a ferroelectric layer pattern disposed on the floating electrode layer pattern, and a word line disposed on the ferroelectric layer pattern. The overlap area between the floating electrode layer pattern and the non-ferroelectric layer pattern in the vertical direction is larger than the overlap area between the ferroelectric layer pattern and the word line in the vertical direction.

There is disclosed a method of manufacturing a semiconductor device. In the method, a stack structure including a first insulating layer, a semiconductor layer, a sacrificial layer, and a second insulating layer that are sequentially stacked over a substrate may be formed. First and second hole patterns penetrating the stack structure may be formed over the substrate. A first recess space extending into the sacrificial layer from one hole pattern of the first and second hole patterns may be formed over the substrate. A non-ferroelectric layer and a floating electrode layer may be formed in the first recess space. A second recess space may be formed to extend into the second insulating layer from the one hole pattern over the substrate, the second recess space being formed to have a smaller recess width than the first recess space. A ferroelectric layer and a first electrode layer may be formed in the second recess space. Second and third electrode layers that are disposed in the first and second hole patterns, respectively, and electrically connected to the semiconductor layer may be formed.

DETAILED DESCRIPTION

Figure 1:
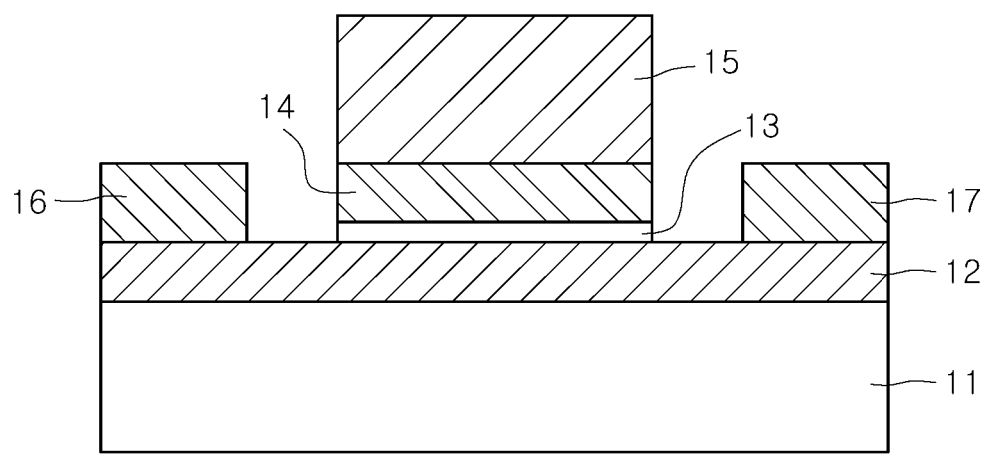
FIG. 1 is a cross-sectional view schematically illustrating a semiconductor device including a ferroelectric layer according to a comparative example.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time. Also, at least a part of each of the above processes may be performed in a reversed order.

FIG. 1 is a cross-sectional view schematically illustrating a semiconductor device including a ferroelectric layer according to a comparative example. Referring to FIG. 1, a semiconductor device 10 may be a field effect transistor (FET)-type ferroelectric memory device.

The semiconductor device 10 may include a substrate 11, a channel layer 12, an interfacial dielectric layer 13, a ferroelectric layer 14, and a gate electrode layer 15. In addition, the semiconductor device 10 may include a source electrode layer 16 and a drain electrode layer 17 that are in contact with opposite ends of the channel layer 12. The channel layer 12 may be a doped crystalline semiconductor layer. The channel layer 12 may be doped with a dopant to have a predetermined electrical conductivity.

The semiconductor device 10 may non-volatilely store different polarization states in the ferroelectric layer 14 as signal information. A write operation on the semiconductor device 10 may be performed by applying a write voltage having a positive polarity or a negative polarity to the gate electrode layer 15, in a state in which the channel layer 12 is grounded, to write the polarization states in the ferroelectric layer 14. The polarization may be controlled to have different polarization orientations and different polarization values. After the applied write voltage is removed, the polarization states written in the ferroelectric layer 14 may be stored as non-volatile signal information.

The interfacial dielectric layer 13 may be disposed between the channel layer 12 and the ferroelectric layer 14, and may serve as a buffer layer to offset a difference in crystal lattice constants between the channel layer 12 and the ferroelectric layer 14. Because the interfacial layer 13 is interposed between the channel layer 12 and the ferroelectric layer 14, it is possible to prevent or reduce defects from occurring at the interface between the channel layer 12 and the ferroelectric layer 14 when the channel layer 12 and the ferroelectric layer 14 are in direct contact with each other. In an example, when the channel layer 12 includes doped silicon (Si), the interfacial dielectric layer 13 may include silicon oxide. The interfacial dielectric layer 13 may have a lower dielectric constant than the ferroelectric layer 14.

A read operation on the semiconductor device 10 may include a process of applying a read voltage to the gate electrode layer 15 in a state in which the channel layer 12 is grounded to generate a conductive channel in the channel layer 12, and a process of applying a voltage between the source electrode layer 16 and the drain electrode layer 17 to generate an operation current flowing along the generated conductive channel. In an example, the magnitude of the threshold voltage for generating the conductive channel may be changed according to the orientation of the polarization or the magnitude of the polarization stored in the ferroelectric layer 14. In another example, the magnitude of the operation current flowing along the conductive channel may be changed according to the orientation of the polarization or the magnitude of the polarization stored in the ferroelectric layer 14. A read operation may proceed as a process of identifying the signal information stored in the ferroelectric layer 14 by reading the level of the threshold voltage or the level of the operation current.

Figure 2:
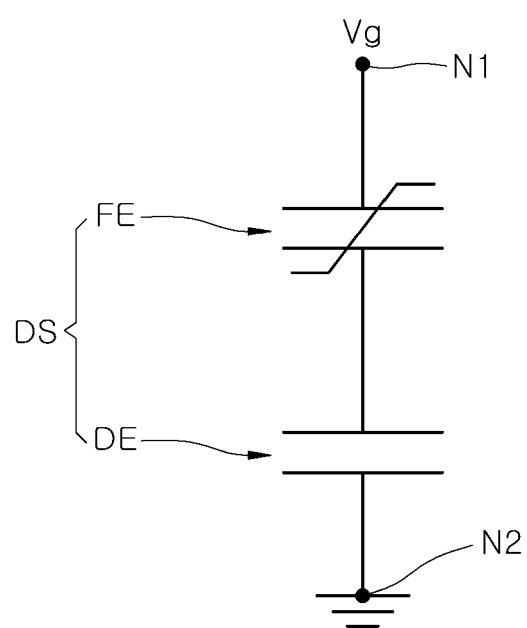
FIG. 2 is a view schematically illustrating an electric circuit configuration of an electronic device including a ferroelectric layer and a non-ferroelectric layer connected in series to each other.

FIG. 2 is a view schematically illustrating an electric circuit configuration of an electronic device including a ferroelectric layer and a non-ferroelectric layer connected in series to each other. Referring to FIG. 2, there is disclosed a capacitor device including a dielectric structure DS between a first node N1 and a second node N2. The dielectric structure DS may include a non-ferroelectric layer DE and a ferroelectric layer FE, which are connected in series to each other. In an example, the non-ferroelectric layer DE may refer to a dielectric layer having no ferroelectric properties, and may be, for example, a paraelectric layer. Referring to the semiconductor device 10 of FIG. 1, the capacitor device may include the interfacial dielectric layer 13 and the ferroelectric layer 14, which are disposed in series between the channel layer 12 and the gate electrode layer 15.

When a predetermined voltage Vg is applied to the first node N1 while the second node N2 is grounded, the capacitance $C_{DS}$ of the dielectric structure DS may be calculated by the following equation (1).

$$1/(C_{DS})=1/(C_{DE})+1/(C_{FE}) \quad (1)$$

Here, $C_{DE}$ is a capacitance of the non-ferroelectric layer DE, and $C_{FE}$ is a capacitance of the ferroelectric layer FE.

Meanwhile, the amount of electric charge charged in the non-dielectric layer DE and the amount of electric charge charged in the ferroelectric layer FE by the predetermined voltage may be the same as in Equation (2).

$$Q_{DE}=Q_{FE} \quad (2)$$

At this time, because the amount of electric charge is calculated as the product of the capacitance and the voltage, the following Equation (3) may be derived from Equation (2).

$$C_{DE}*V_{DE}=C_{FE}*V_{FE} \quad (3)$$

Here, $V_{DE}$ is a voltage applied to the non-ferroelectric layer DE in the electric circuit of FIG. 2, and $V_{FE}$ is a voltage applied to the ferroelectric layer FE in the electric circuit of FIG. 2.

From Equation (3), the following Equation (4) may be derived.

$$V_{FE}/V_{DE}=C_{DE}/C_{FE} \quad (4)$$

According to Equation (4), as the capacitance of the ferroelectric layer FE increases with respect to the capacitance of the non-ferroelectric layer DE, the ratio $V_{FE}/V_{DE}$ may decrease. That is, when the predetermined voltage Vg is applied to the first node N1 in the electric circuit of FIG. 2, as the capacitance of the ferroelectric layer FE increases with respect to the capacitance of the non-ferroelectric layer DE, the ratio of the voltage distributed to the non-ferroelectric layer DE to the voltage distributed to the ferroelectric layer FE from the predetermined voltage Vg may be increased.

Meanwhile, the dielectric constant of the ferroelectric layer FE may be greater than the dielectric constant of the non-ferroelectric layer DE. Accordingly, as illustrated in FIG. 1, when the overlap area of the interfacial dielectric layer (i.e., the non-ferroelectric layer) 13 and the ferroelectric layer 14 in the z-direction are the same between the channel layer 12 and the gate electrode layer 15, the capacitance of the ferroelectric layer 14 may be greater than the capacitance of the interfacial dielectric layer 13, based on the difference in dielectric constant. Accordingly, when a predetermined voltage is applied to the gate electrode layer 15, according to Equation (4), the voltage distributed to the interfacial dielectric layer 13 may be greater than the voltage distributed to the ferroelectric layer 14 from the predetermined voltage. That is, the electric field generated by the voltage may be relatively strongly concentrated on the interfacial dielectric layer 13 rather than on the ferroelectric layer 14.

Referring to FIG. 1, the thickness of the interfacial dielectric layer 13, which has a relatively small dielectric constant, may be thinner than the thickness of the ferroelectric layer 14. This is to prevent excessive reduction of the total capacitance of the capacitor in which the interfacial dielectric layer 13 and the ferroelectric layer 14 are connected in series because the interfacial dielectric layer 13 has a lower dielectric constant. However, with repeated operations of the semiconductor device 10 with the above configuration, the electric field is concentrated on the interfacial dielectric layer 13 having a relatively thin thickness. Thus, the electrical properties of the interfacial dielectric layer 13, including leakage current and breakdown voltage, may deteriorate over time. As a result, endurance of the semiconductor device 10 may be reduced.

In a semiconductor device according to an embodiment of the present disclosure, which will be described below, the ratio $C_{DE}/C_{FE}$ of Equation (3) may be increased by controlling the areas of the non-ferroelectric layer DE and the ferroelectric layer FE. Accordingly, as the ratio $V_{FE}/V_{DE}$ is increased, the electric field concentrated on the non-ferroelectric layer DE may be reduced compared to the ferroelectric layer FE. As a result, it is possible to compensate for deterioration in endurance of the above-described semiconductor device. In addition, the semiconductor device is configured to have a three-dimensional structure, so that the cell integration degree of the semiconductor device may be improved.

Figure 3:
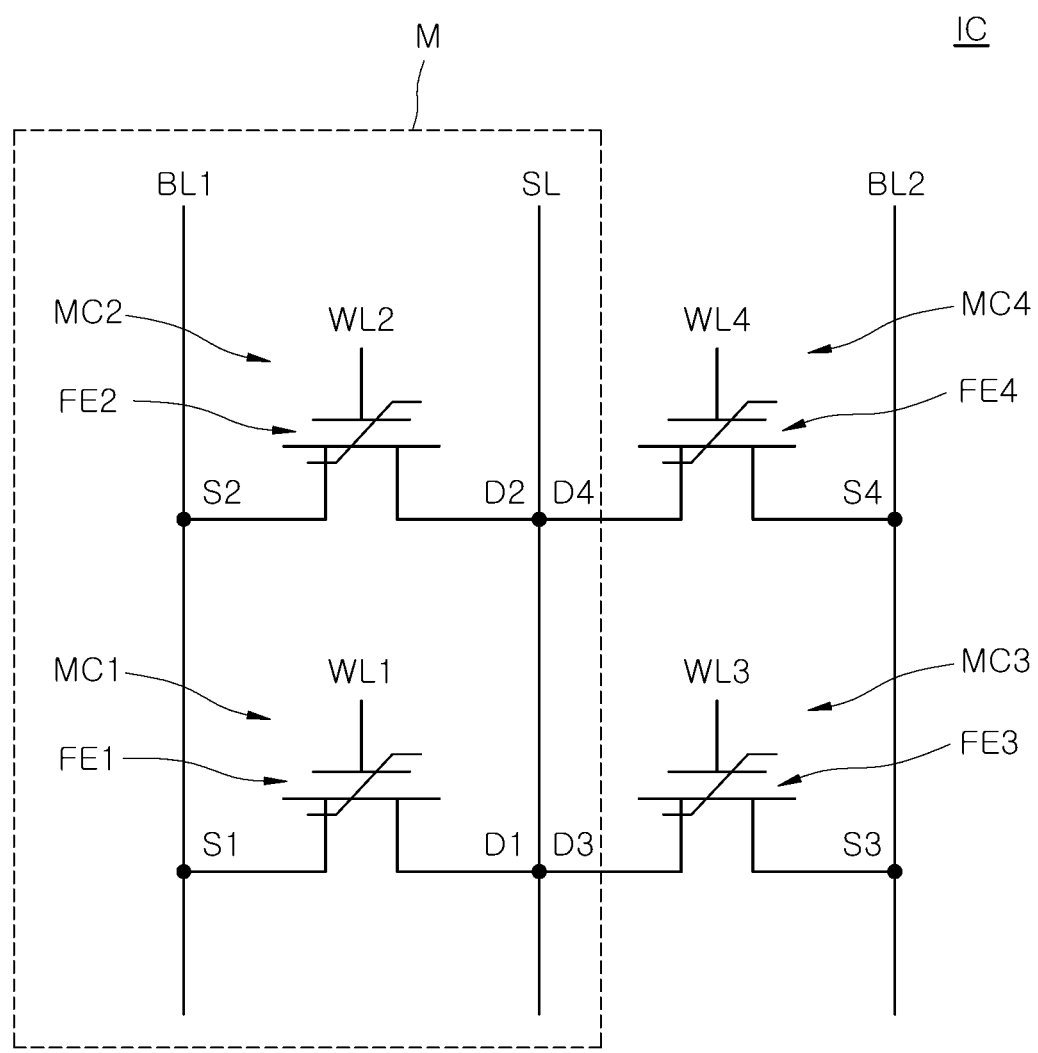
FIG. 3 is a schematic circuit diagram of a semiconductor device according to an embodiment of the present disclosure.

FIG. 3 is a schematic circuit diagram of a semiconductor device according to an embodiment of the present disclosure. Referring to FIG. 3, a semiconductor device IC may include a plurality of unit cells MC1, MC2, MC3, and MC4 that are disposed between a source line SL and first and second bit lines BL1 and BL2. In FIG. 3, four first to fourth unit cells MC1, MC2, MC3, and MC4 are disclosed as an example, but the present disclosure is not necessarily limited thereto, and various other number of unit cells may be utilized in other embodiments.

Referring to FIG. 3, each of the first to fourth unit cells MC1, MC2, MC3, and MC4 may be a field effect transistor (FET)-type memory cell. The first to fourth unit cells MC1, MC2, MC3, and MC4 may include first to fourth ferroelectric layers FE1, FE2, FE3, and FE4, respectively, as memory layers. Although not illustrated, the memory layers of the first to fourth unit cells MC1, MC2, MC3, and MC4 may include interfacial dielectric layers connected in series to the first to fourth ferroelectric layers FE1, FE2, FE3, and FE4, respectively. Each of the interfacial dielectric layers may be a non-ferroelectric layer. The first to fourth ferroelectric layers FE1, FE2, FE3, and FE4 of the first to fourth unit cells MC1, MC2, MC3, and MC4 may be electrically connected to first to fourth word lines WL1, WL2, WL3, and WL4, respectively.

The source electrodes S1 and S2 of the field effect transistors constituting the first and second unit cells MC1 and MC2, respectively, may be connected to the first bit line BL1 in common. The drain electrodes D1 and D2 of the field effect transistors constituting the first and second unit cells MC1 and MC2, respectively, may be connected to the source line SL in common. The source electrodes S3 and S4 of the field effect transistors constituting the third and fourth unit cells MC3 and MC4, respectively, may be connected to the second bit line BL2 in common. The drain electrodes D3 and D4 of the field effect transistors constituting the third and fourth unit cells MC3 and MC4, respectively, may be connected to the source line SL in common. The first to fourth unit cells MC1, MC2, MC3, and MC4 may share the source line SL. The circuit configuration of the semiconductor device IC illustrated in FIG. 3 may be applied to a semiconductor device 1 according to an embodiment of the present disclosure described below.

Figure 4:
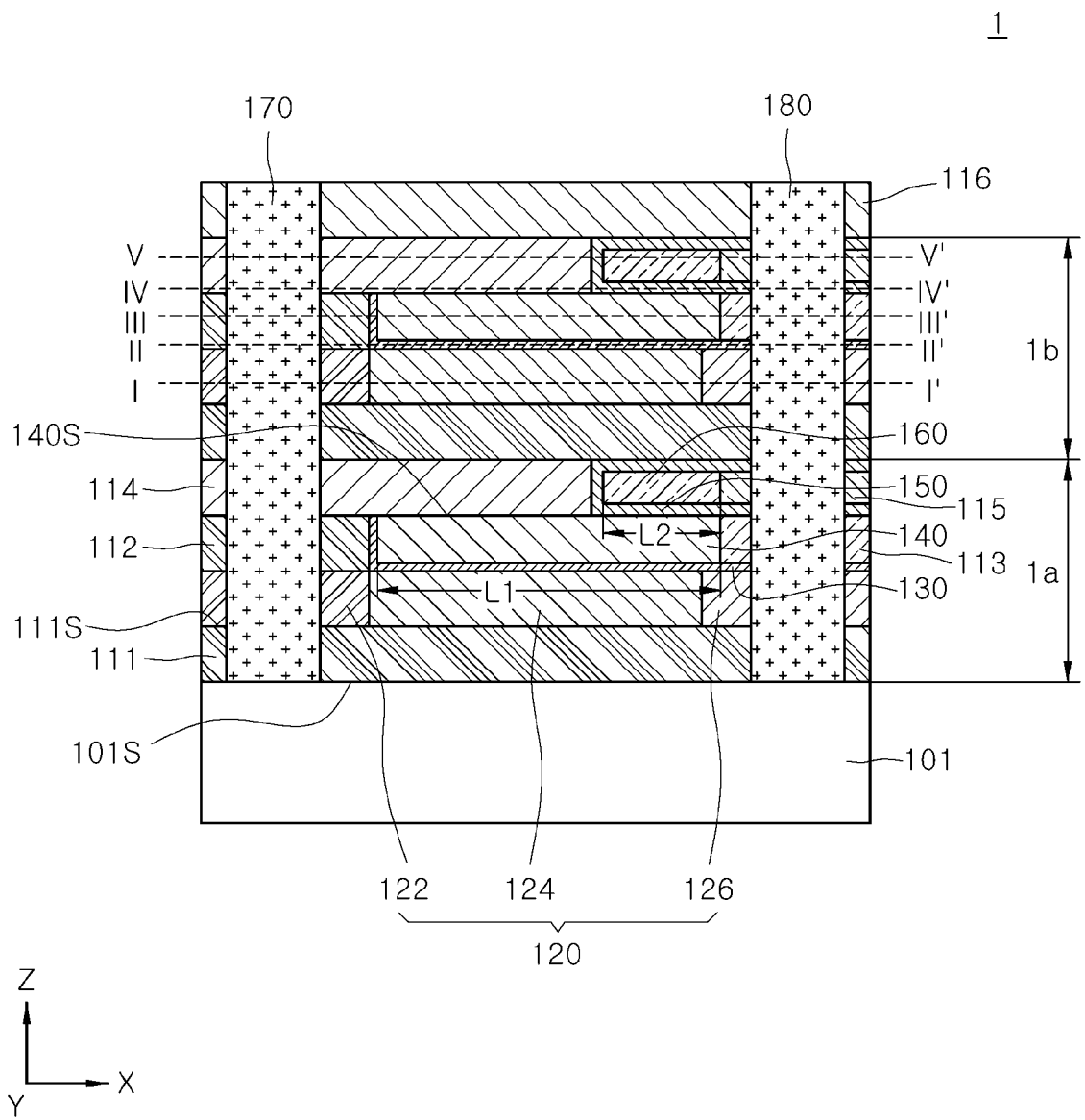
FIG. 4 is a cross-sectional view schematically illustrating a semiconductor device according to an embodiment of the present disclosure.
Figure 5:
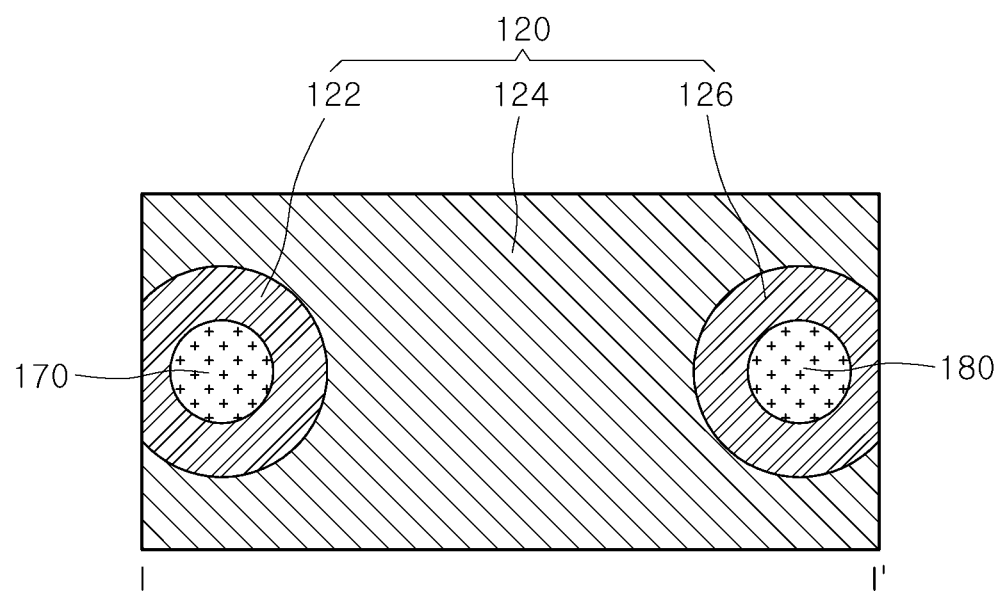
FIG. 5 is a plan view illustrating a semiconductor device of FIG. 4 taken along a line I-I' on an x-y plane.
Figure 6:
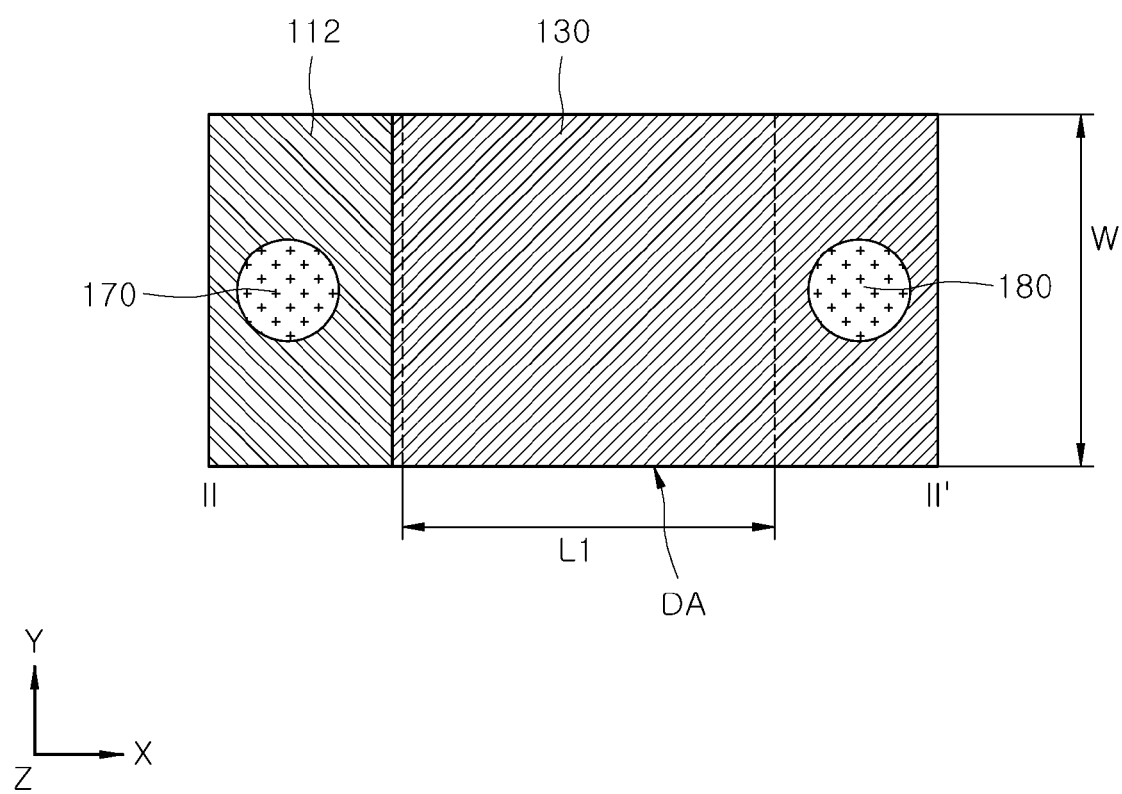
FIG. 6 is a plan view illustrating a semiconductor device of FIG. 4 taken along a line II-II' on an x-y plane.
Figure 7:
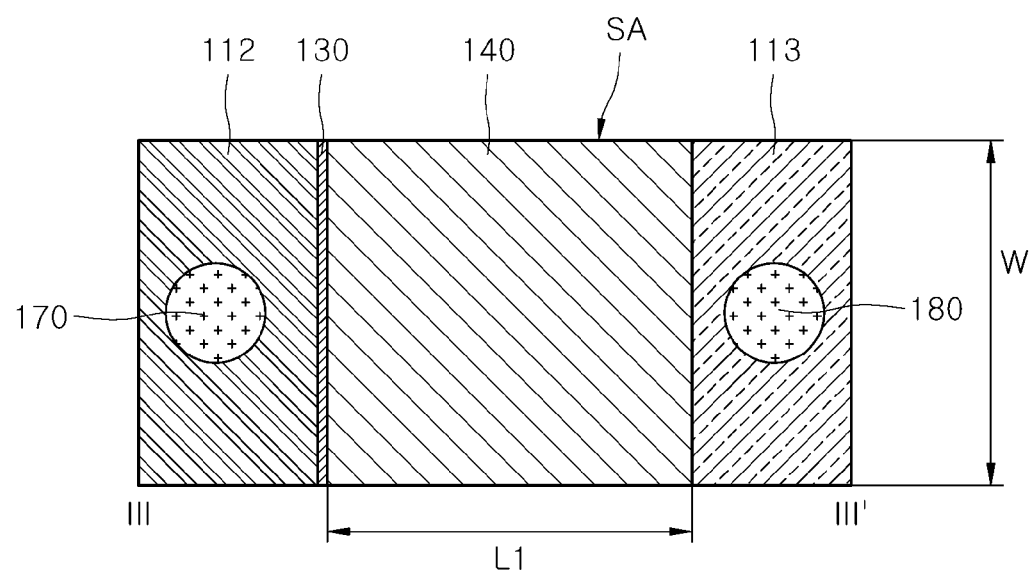
FIG. 7 is a plan view illustrating a semiconductor device of FIG. 4 taken along a line III-III' on an x-y plane.
Figure 8:
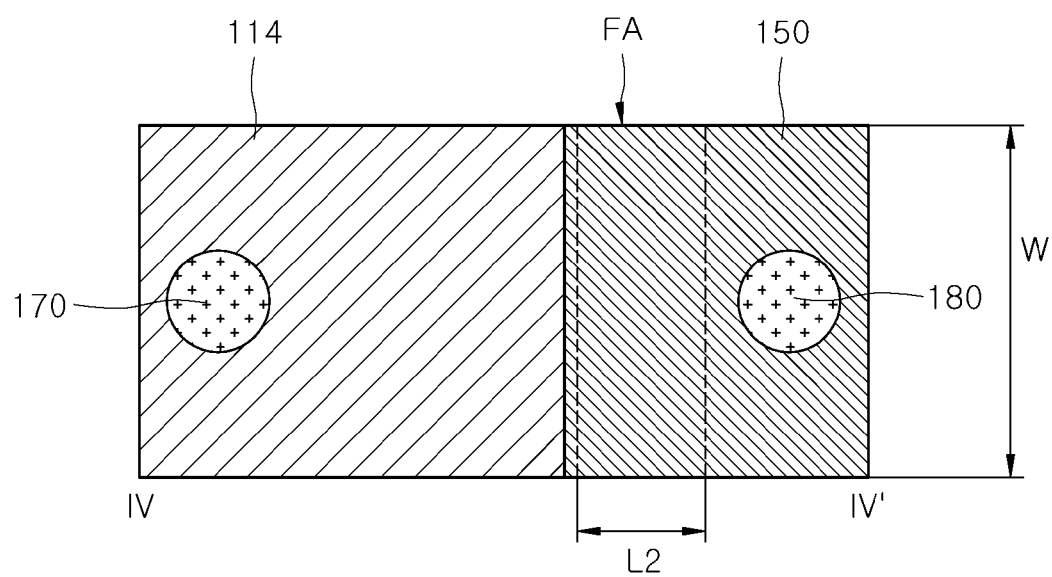
FIG. 8 is a plan view illustrating a semiconductor device of FIG. 4 taken along a line IV-IV' on an x-y plane.
Figure 9:
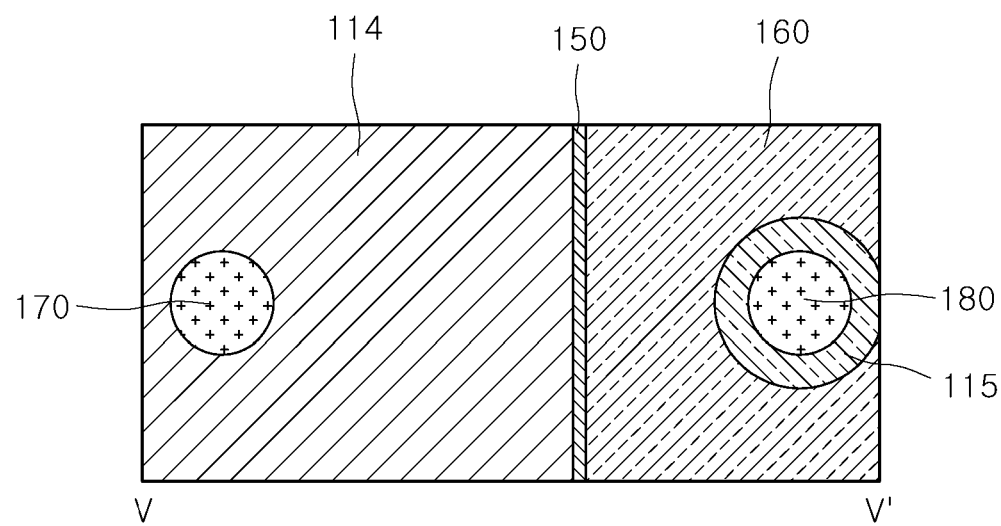
FIG. 9 is a plan view illustrating a semiconductor device of FIG. 4 taken along a line V-V' on an x-y plane.

FIG. 4 is a cross-sectional view schematically illustrating a semiconductor device according to an embodiment of the present disclosure. FIG. 5 is a plan view illustrating a semiconductor device of FIG. 4 taken along a line I-I' on an x-y plane. FIG. 6 is a plan view illustrating a semiconductor device of FIG. 4 taken along a line II-II' on an x-y plane. FIG. 7 is a plan view illustrating a semiconductor device of FIG. 4 taken along a line III-III' on an x-y plane. FIG. 8 is a plan view illustrating a semiconductor device of FIG. 4 taken along a line IV-IV' on an x-y plane. FIG. 9 is a plan view illustrating a semiconductor device of FIG. 4 taken along a line V-V' on an x-y plane. The semiconductor device 1 of FIGS. 4 to 9 may correspond to portion 'M' in the circuit diagram of the semiconductor device IC of FIG. 3.

Referring to FIGS. 4 to 9, a semiconductor device 1 may include a substrate 101, a bit line 170 and a source line 180 that extend in a direction perpendicular to a surface of the substrate 101, and a plurality of unit cell structures 1a and 1b that are electrically connected to the bit line 170 and the source line 180. Although the first and second unit cell structures 1a and 1b are disclosed in FIG. 4 as an example, the number of unit cell structures 1a and 1b stacked on the substrate 101 might not be limited to any specific number. A capping insulating layer 116 may be disposed on the uppermost unit cell structure 1b.

Referring to FIG. 4, the substrate 101 may be provided. The substrate 101 may include a semiconductor material. For example, the semiconductor material may include silicon (Si), germanium (Ge), gallium arsenide (GaAs), molybdenum selenide ($MoSe_2$), hafnium selenide ($HfSe_2$), indium selenide (InSe), gallium selenide (GaSe), black phosphorus, indium-gallium-zinc oxide (IGZO), or a combination of two or more thereof. The semiconductor material may be doped with a dopant. The semiconductor material may be doped, for example, with an N-type dopant or a p-type dopant.

Integrated circuits may be disposed on the substrate 101. The integrated circuits may include, for example, driving circuits or control circuits for the first and second unit cell structures 1a and 1b. The integrated circuit may include at least one field effect transistor.

The bit line 170 and the source line 180 may be disposed on the substrate 101 to extend in a direction (e.g., the z-direction) that is substantially perpendicular to a surface 101S of the substrate 101. The bit line 170 and the source line 180 may be disposed to be spaced apart from each other on the substrate 101. The bit line 170 and the source line 180 may correspond to the first bit line BL1 and the source line SL, respectively, in the portion "M" of the circuit diagram of FIG. 3.

Each of the bit line 170 and the source line 180 may include a conductive pillar-like structure. For example, each of the bit line 170 and the source line 180 may be a structure in the form of a circular pillar or an elliptical pillar. As another example, each of the bit line 170 and the source line 180 may be a structure in the form of a polygonal pillar. As another example, one of the bit line 170 and the source line 180 may be a structure in the form of a circular pillar or an elliptical pillar, and the other may be a structure in the form of a polygonal pillar.

Each of the bit line 170 and the source line 180 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. In an embodiment, the bit line 170 and the source line 180 may be formed using substantially the same material.

In some embodiments, the functions of the bit line 170 and the source line 180 may be interchanged according to the circuit design of the semiconductor device 1. That is, the bit line 170 of FIG. 4 may function as a source line, and the source line 180 may function as a bit line.

Referring to FIG. 4, the first and second unit cell structures 1a and 1b may be stacked and disposed on the substrate 101 in a direction (e.g., the z-direction) that is substantially perpendicular to the surface 101S of the substrate 101. The first and second unit cell structures 1a and 1b may correspond to the first and second unit cells MC1 and MC2 in the circuit diagram of FIG. 3.

The first and second unit cell structures 1a and 1b may have substantially the same configuration. The first and second unit cell structures 1a and 1b of FIG. 4 may be commonly connected to the bit line 170 and the source line 180, and may correspond to the electric circuit in the portion 'M' of FIG. 3. Each of the first and second unit cell structures 1a and 1b may be connected to a different and separate word line 160.

Referring to FIG. 4, each of the first and second unit cell structures 1a and 1b may include a semiconductor layer 120 disposed on a plane 111S that is substantially parallel to the surface 101S of the substrate 101, a non-ferroelectric layer pattern 130 disposed on the semiconductor layer 120, a floating electrode layer pattern 140 disposed on the non-ferroelectric layer pattern 130, a ferroelectric layer pattern 150 disposed on the floating electrode layer pattern 140, and a word line 160 disposed on the ferroelectric layer pattern 150. Each of the first and second unit cell structures 1a and 1b may further include a base insulating layer 111 disposed under the semiconductor layer 120.

According to an embodiment, an area DA, as illustrated in FIG. 6, in which the floating electrode layer pattern 140 and the non-ferroelectric layer pattern 130 overlap with each other over the semiconductor layer 120 in a vertical direction that is substantially perpendicular to a surface of the substrate (e.g., the z-direction) may be greater than an area FA, as illustrated in FIG. 8, in which the ferroelectric layer pattern 150 and the word line 160 overlap with each other on the floating electrode layer pattern 140 in the vertical direction. Hereinafter, the configurations of the first and second unit cell structures 1a and 1b will be described in detail.

Referring to FIG. 4, the base insulating layer 111 may be disposed on the substrate 101. The base insulating layer 111 may function as an insulating layer that separates the first unit cell 1a and the substrate 101 from each other, and as an insulating layer that separates the first and second unit cells 1a and 1b from each other. The base insulating layer 111 may include, for example, oxide, nitride, oxynitride, or a combination of two or more thereof.

Referring to FIGS. 4 and 5 together, the semiconductor layer 120 may be disposed on an upper surface 111S of the base insulating layer 111. The upper surface 111S of the base insulating layer 111 may be a plane parallel to the surface 101S of the substrate 101. As an example, the upper surface 111S of the base insulating layer 111 may be an x-y plane that is perpendicular to the z-direction. The semiconductor layer 120 may be disposed between the bit line 170 and the source line 180. In an embodiment, the semiconductor layer 120 may be disposed to contact the bit line 170 and the source line 180.

The semiconductor layer 120 may include a semiconductor material. The semiconductor material may include, for example, silicon (Si), germanium (Ge), gallium arsenide (GaAs), or the like. The semiconductor material may include, for another example, a two-dimensional semiconductor material. The two-dimensional semiconductor material may include, for example, transition metal dichalcogenide (TMDC), black phosphorous, or the like. The transition metal dichalcogenide (TMDC) may include, for example, molybdenum selenide ($MoSe_2$), hafnium selenide ($HfSe_2$), indium selenide (InSe), gallium selenide (GaSe), or the like. The semiconductor material may include, for example, metal oxide such as Indium-gallium-zinc oxide (IGZO). The semiconductor layer 120 may be doped with an n-type or p-type dopant. The semiconductor layer 120 may have different electrical conductivities according to the amount of the dopant.

The semiconductor layer 120 may include a first doped region 122 in contact with the bit line 170, a second doped region 126 in contact with the source line 180, and a channel region 124 disposed between the first doped region 122 and the second doped region 126. As illustrated in FIG. 5, the first and second doped regions 122 and 126 may be disposed to surround the bit line 170 and the source line 180, respectively.

The first and second doped regions 122 and 126 may be doped with the same type of dopant. The channel region 124 may be doped with a different type of dopant from the first and second doped regions 122 and 126. As an example, when the first and second doped regions 122 and 126 are doped with an n-type dopant, and the channel region 124 may be doped with a p-type dopant. As another example, when the first and second doped regions 122 and 126 are doped with a p-type dopant, and the channel region 124 may be doped with an n-type dopant. In an embodiment, the first doped region 122 may be a source region and the second doped region 126 may be a drain region and may correspond to the portion 'M' of the circuit diagram of FIG. 3.

Referring to FIGS. 4 and 6 together, the non-ferroelectric layer pattern 130 may be disposed on the semiconductor layer 120. In addition, the non-ferroelectric layer pattern 130 may be disposed on a sidewall surface of a first interlayer separation layer 112 disposed on the semiconductor layer 120. In an embodiment, when the semiconductor layer 120 includes silicon (Si) and the first interlayer separation layer 112 includes silicon germanium (SiGe), the non-ferroelectric layer pattern 130 may include silicon oxide. As described later, the non-ferroelectric layer pattern 130 may be formed by partially oxidizing the semiconductor layer 120 and the first interlayer separation layer 112. The non-ferroelectric layer pattern 130 may contact the source line 180.

The non-ferroelectric layer pattern 130 may refer to a dielectric layer having no ferroelectric properties, such as for example a paraelectric layer. The dielectric constant of the non-ferroelectric layer pattern 130 may be smaller than the dielectric constant of the ferroelectric layer pattern 150. In an embodiment, the non-ferroelectric layer pattern 130 may include silicon oxide, and the ferroelectric layer pattern 150 may include hafnium oxide, zirconium oxide, hafnium zirconium oxide, $Pb(Zr, Ti)O_3$, $SrBi_2Ta_2O_9$, $(Bi, La)_4Ti_3O_{12}$, $BiFeO_3$, or a combination of two or more thereof.

The first interlayer separation layer 112 may include an un-doped semiconductor material. The first interlayer separation layer 112 may have a relatively low electrical conductivity compared to the semiconductor layer 120. Accordingly, the current flow passing through the first interlayer separation layer 112 may be controlled to a low enough level to prevent or reduce operational errors in the semiconductor device 1.

Referring to FIG. 6, the non-ferroelectric layer pattern 130 may include the first overlap region DA that overlaps with the floating electrode layer pattern 140 in the z-direction. The first overlap region DA may have a first length L1 in the x-direction and a width W in the y-direction.

Referring FIGS. 4 and 7 together, the floating electrode layer 140 may be disposed on the non-ferroelectric layer pattern 130. The floating electrode layer pattern 140 may be disposed to contact a first interlayer insulating layer 113 in a lateral direction (e.g., the x-direction).

The floating electrode layer pattern 140 may include a conductive material. The conductive material may include, for example, metal, conductive metal nitride, conductive metal oxide, or the like. The floating electrode layer pattern 140 may be electrically floated in the first and second unit cell structures 1a and 1b.

As illustrated in FIG. 7, the floating electrode layer pattern 140 may have a predetermined surface area SA on the x-y plane. The surface area SA may have a first length L1 in the x-direction and a width W in the y-direction. The surface area SA may be substantially the same as the overlap region DA in FIG. 6.

The floating electrode layer pattern 140 may form an interface with the ferroelectric layer pattern 150 to prevent a depolarization electric field from being generated inside the ferroelectric layer pattern 150. As an example, when ferroelectric polarization is formed in the ferroelectric layer pattern 150, electric charge induced by the ferroelectric polarization may be distributed in the ferroelectric layer pattern 150 adjacent to the interface with the floating electrode layer pattern 140. The floating electrode layer pattern 140 may distribute a sufficient amount of electric charge having an opposite polarity to screen the induced electric charge in the inner region of the floating electrode layer pattern 140 adjacent to the interface. Accordingly, the charge induced in the ferroelectric layer pattern 150 by the ferroelectric polarization may be offset by the charge having an opposite polarity in the floating electrode layer pattern 140. Accordingly, generation of the depolarization electric field in the ferroelectric layer pattern 150 may be suppressed. As a result, deterioration of the ferroelectric polarization in the ferroelectric layer pattern 150 may be prevented.

The first interlayer insulating layer 113 may electrically insulate the floating electrode layer pattern 140 from the source line 180. The first interlayer insulating layer 113 may include, for example, oxide, nitride, oxynitride, or a combination of two or more thereof. Accordingly, the floating electrode layer pattern 140 may be disposed to be spaced apart from the source line 180 in the x-direction.

Referring to FIGS. 4 and 8 together, the ferroelectric layer pattern 150 may be disposed on the floating electrode layer pattern 140. More specifically, the ferroelectric layer pattern 150 may be disposed on the floating electrode layer pattern 140 and the first interlayer insulating layer 113. In addition, the ferroelectric layer pattern 150 may be disposed on the sidewall surface of a second interlayer separation layer 114. In addition, the ferroelectric layer pattern 150 may be disposed to contact the base insulating layer 111 or the capping insulating layer 116 of another unit cell.

Each of the second interlayer separation layer 114 and the capping insulating layer 116 may include an insulating material. The insulating material may include, for example, oxide, nitride, oxynitride, or a combination thereof. In addition, the ferroelectric layer pattern 150 may be in contact with the source line 180.

The ferroelectric layer pattern 150 may include a ferroelectric material having remnant polarization. The ferroelectric layer pattern 150 may include crystalline metal oxide. The ferroelectric layer pattern 150 may include binary metal oxide. The ferroelectric layer pattern 150 may include, for example, hafnium oxide, zirconium oxide, hafnium zirconium oxide, or a combination of two or more thereof. In another embodiment, the ferroelectric layer pattern 150 may include a ternary or higher metal oxide. For example, the ferroelectric layer pattern 150 may include $Pb(Zr, Ti)O_3$, $SrBi_2Ta_2O_9$, $(Bi, La)_4Ti_3O_{12}$, $BiFeO_3$, or a combination of two or more thereof. The dielectric constant of the ferroelectric layer pattern 150 may be greater than the dielectric constant of the non-ferroelectric layer pattern 130.

Referring to FIG. 4, the ferroelectric layer pattern 150 may be disposed to cover only a portion of the upper surface 140S of the floating electrode layer pattern 140. Referring to FIG. 8, the ferroelectric layer pattern 150 may include the second overlap region FA that overlaps with the word line 160 in the z-direction. The second overlap region FA may have a second length L2 in the x-direction and a width W in the y-direction. Referring to FIGS. 6 and 8 together, the area of the first overlap region DA may be greater than the area of the second overlap region FA.

Referring to FIGS. 4 and 9 together, the word line 160 may be disposed on the ferroelectric layer pattern 150. The word line 160 may include metal or metal nitride. The word line 160 may extend in a direction (e.g., the y-direction) that is substantially parallel to the surface 101S of the substrate 101. As described above, the word line 160 may be disposed to overlap a portion of the floating electrode layer pattern 140 in a direction (e.g., the z-direction) that is substantially perpendicular to the surface 101S of the substrate 101.

The word line 160 may be disposed to be spaced apart from the source line 180. A second interlayer insulating layer 115 may electrically insulate the word line 160 from the source line 180. The second interlayer insulating layer 115 may include, for example, oxide, nitride, oxynitride, or a combination thereof.

As described above, in the unit cell structures 1a and 1b of the semiconductor device 1 according to an embodiment of the present disclosure, the non-ferroelectric layer pattern 130 and the ferroelectric layer pattern 150 may be connected in series to each other between the channel region 124 and the word line 160. The area of the first overlap region DA in which the floating electrode layer pattern 140 and the non-ferroelectric layer pattern 130 overlap with each other on the semiconductor layer 120 may be greater than the area of the second overlap region FA in which the ferroelectric layer pattern 150 and the word line 160 overlap with each other on the floating electrode layer pattern 140.

In semiconductor devices of the disclosed embodiments, the ratio $C_{DE}/C_{FE}$ in Equation (4) changes with changes in the difference in area between the first overlap region DA and the second overlap region FA. As the area of the first overlap region DA increases with respect to the second overlap region FA, the ratio $C_{DE}/C_{FE}$ and the ratio $V_{FE}/V_{DE}$ may increase. That is, when the predetermined voltage Vg is applied to the second node N2 in the electric circuit of FIG. 2, the voltage distributed to the ferroelectric layer FE from the predetermined voltage Vg may increase so that the concentration of the electric field on the non-ferroelectric layer DE may be alleviated. As a result, when an operation voltage is applied between the channel region 124 and the word line 160 in the semiconductor device 1 of FIG. 4, deterioration of electrical properties of the non-ferroelectric layer pattern 130 due to the concentration of the electric field of the operation voltage in the non-ferroelectric layer 130 may be prevented. Accordingly, endurance of the semiconductor device 1 may be improved. Also, because the semiconductor device 1 has a three-dimensional structure in which unit cell structures are stacked in a direction substantially perpendicular to the surface 101S of the substrate 101, the cell integration degree of the semiconductor device 1 may be improved.

FIGS. 10 to 19 are cross-sectional views schematically illustrating a method of manufacturing a semiconductor device according to an embodiment of the present disclosure. The method described with reference to FIGS. 10 to 19 may be applied to a method of manufacturing the semiconductor device 1 described with reference to FIGS. 4 to 9.

Figure 10:
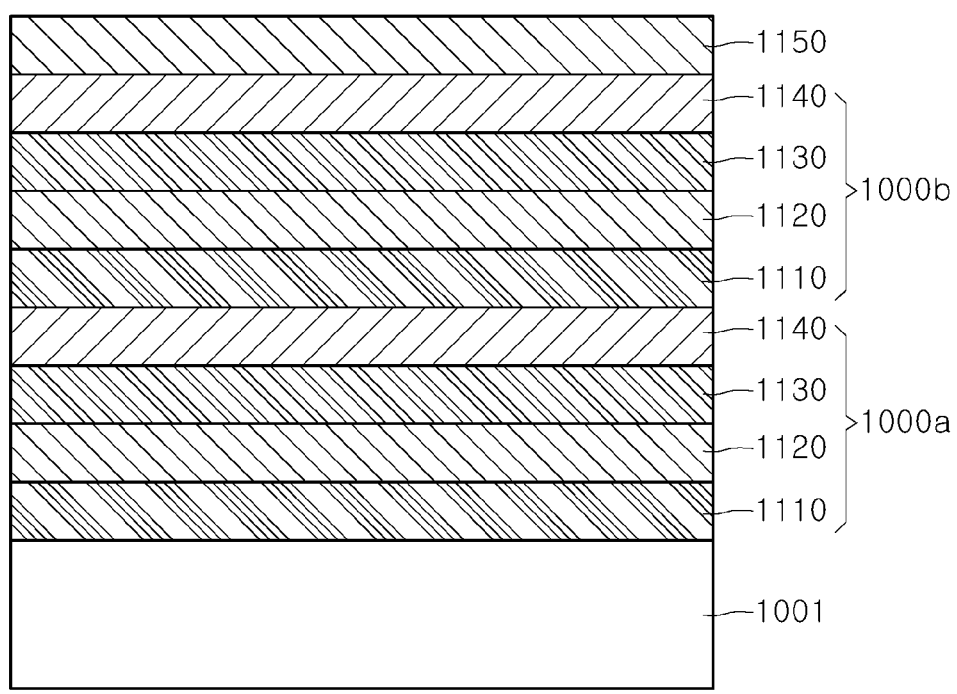
FIGS. 10 to 19 are cross-sectional views schematically illustrating a method of manufacturing a semiconductor device according to an embodiment of the present disclosure.

Referring to FIG. 10, a substrate 1001 may be provided. The substrate 1001 may be substantially the same as the substrate 101 described above with reference to FIG. 4.

Next, a first stack structure 1000a may be formed on the substrate 1001. The first stack structure 1000a may include a first insulating layer 1110, a semiconductor layer 1120, a sacrificial layer 1130, and a second insulating layer 1140 that are sequentially stacked on the substrate 1001.

Each of the first and second insulating layers 1110 and 1140 may include, for example, oxide, nitride, or oxynitride. However, the first and second insulating layers 1110 and 1140 may have etch selectivity with respect to each other.

The semiconductor layer 1120 may include a semiconductor material. The semiconductor material may include, for example, silicon (Si), germanium (Ge), gallium arsenide (GaAs), or the like. The semiconductor material may include, for another example, two-dimensional semiconductor material. The two-dimensional semiconductor material may include transition metal dichalcogenide (TMDC), black phosphorus, or the like. The transition metal dichalcogenide may include, for example, molybdenum selenide ($MoSe_2$), hafnium selenide ($HfSe_2$), indium selenide (InSe), gallium selenide (GaSe), or the like. The semiconductor material may include, for example, metal oxide such as indium-gallium-zinc oxide (IGZO). The semiconductor layer 1120 may be doped with an N-type dopant or a p-type dopant. The semiconductor layer 1120 may have different electrical conductivities depending on the amount of the dopant.

The sacrificial layer 1130 may include an oxidizable semiconductor material. As an example, the semiconductor material may include silicon (Si) or silicon germanium (SiGe). The semiconductor material of the sacrificial layer 1130 might not be doped with a dopant. Accordingly, the sacrificial layer 1130 may have a sufficiently low electrical conductivity relative to the semiconductor layer 1120.

The first insulating layer 1110, the semiconductor layer 1120, the sacrificial layer 1130, and the second insulating layer 1140 may have etch selectivity with respect to each other. In an embodiment, the first insulating layer 1110 may include silicon oxide, the semiconductor layer 1120 may include n-type or p-type doped silicon (Si), the sacrificial layer 1130 may include un-doped silicon germanium (SiGe), and the second insulating layer 1140 may include silicon nitride. The first insulating layer 1110, the semiconductor layer 1120, the sacrificial layer 1130, and the second insulating layer 1140 may be formed through, for example, a chemical vapor deposition method, a sputtering method, an atomic layer deposition method, or the like.

Referring to FIG. 10, a second stack structure 1000b may be formed on the first stack structure 1000a. The configuration of the second stack structure 1000b may be substantially the same as the configuration of the first stack structure 1000a. That is, the second stack structure 1000b may include the first insulating layer 1110, the semiconductor layer 1120, the sacrificial layer 1130, and the second insulating layer 1140, which are sequentially stacked on the second insulating layer 1140 of the first stack structure 1000a. The method of forming the second stack structure 1000b may be substantially the same as the method of forming the first stack structure 1000a. Although not illustrated, another stack structure may be additionally formed on the second stack structure 1000b, and so on. Additional stack structures may have substantially the same configuration as the first stack structure 1000a.

Referring to FIG. 10, a capping insulating layer 1150 may be formed on the second stack structure 1000b as the uppermost stack structure. The configuration of the capping insulating layer 1150 may be substantially the same as the configuration of the first insulating layer 1110.

Figure 11:
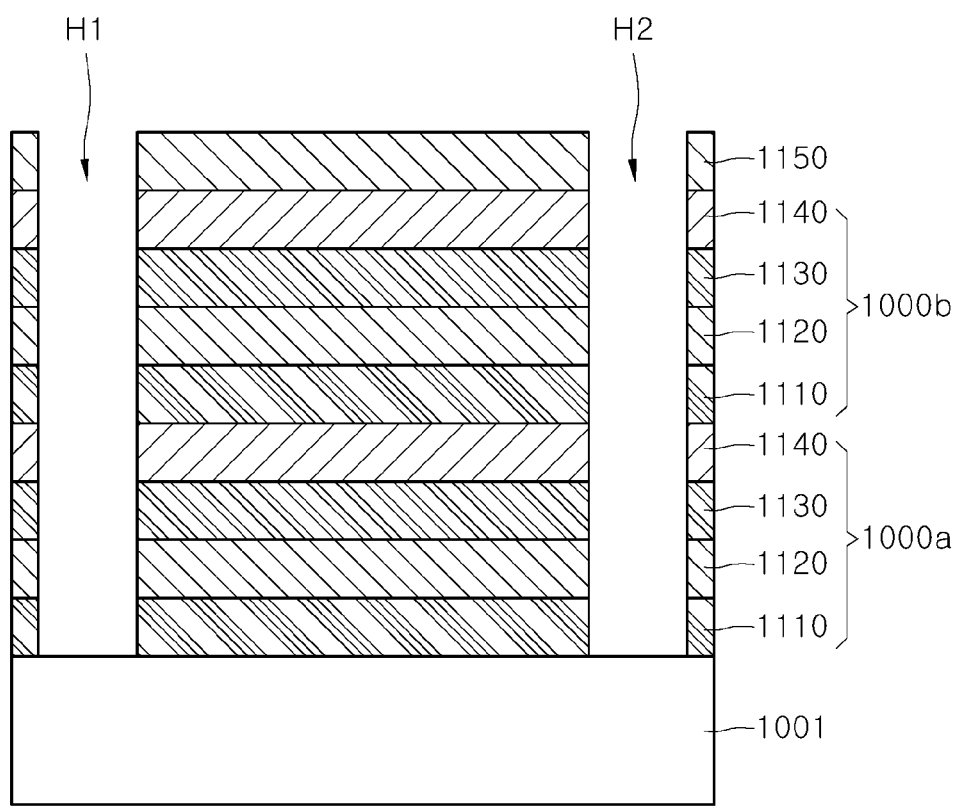

Referring to FIG. 11, the first and second stack structures 1000a and 1000b and the capping insulating layer 1150 may be selectively etched over the substrate 1001 to form first and second hole patterns H1 and H2 that are spaced apart from each other. The first and second hole patterns H1 and H2 may penetrate the first and second stack structures 1000a and 1000b and the capping insulating layer 1150 to expose the substrate 1001. In some embodiments, each of the first and second hole patterns H1 and H2 may be a contact hole pattern having a circular, oval, or polygonal bottom surface.

Figure 12:
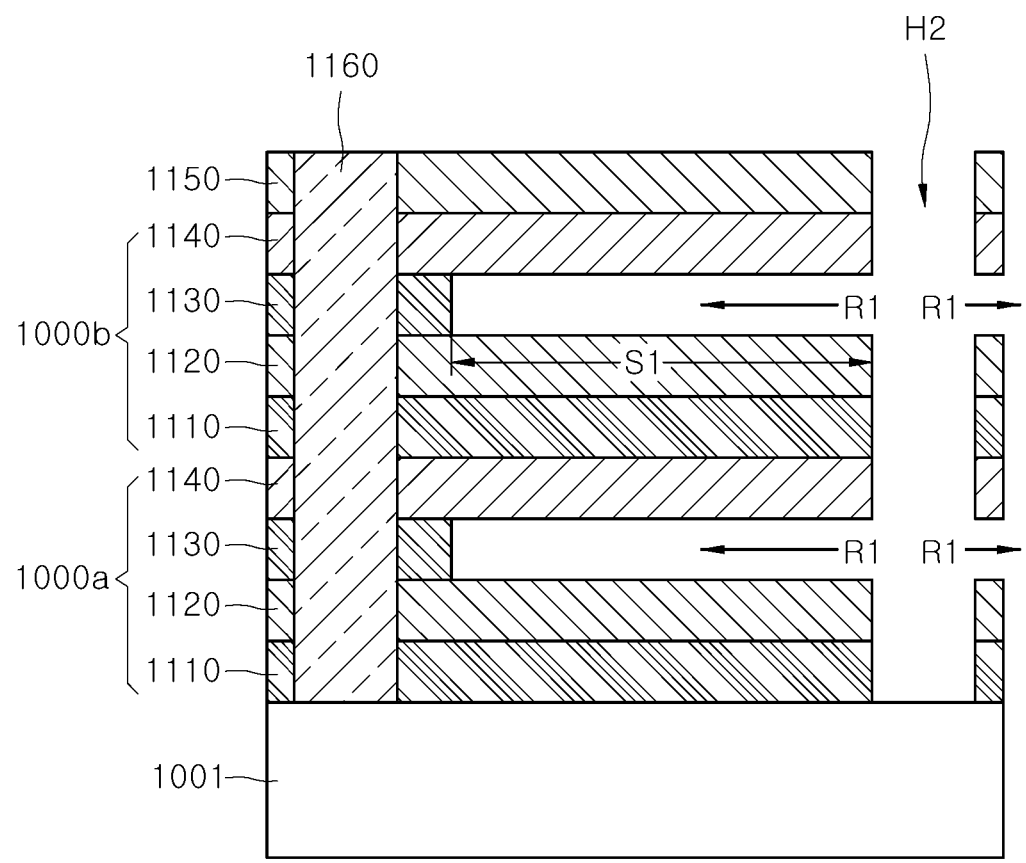

Referring to FIG. 12, a first passivation layer 1160 may be formed to fill the first hole pattern H1 on the substrate 1001, and a first etchant may be provided inside the second hole pattern H2 to selectively etch the sacrificial layer 1130. Through the etch process, the sacrificial layer 1130 may be partially removed and a first recess space R1 may be formed to extend partway into the sacrificial layer 1130. The first recess space R1 may have a first recess width S1 along a direction (e.g., the x-direction) on a plane (i.e., the x-y plane) that is substantially parallel to the surface of the substrate 1001.

Except for the sacrificial layer 1130, the first and second insulating layers 1110 and 1140, the semiconductor layer 1120, and the first passivation layer 1160 may have etch resistance with respect to the first etchant. The first passivation layer 1160 may include, for example, oxide, nitride, oxynitride, or a combination thereof. As another example, the first passivation layer 1160 may include a polymer such as a photosensitive resist material. After the first recess space R1 is formed, the first passivation layer 1160 may be removed.

Figure 13:
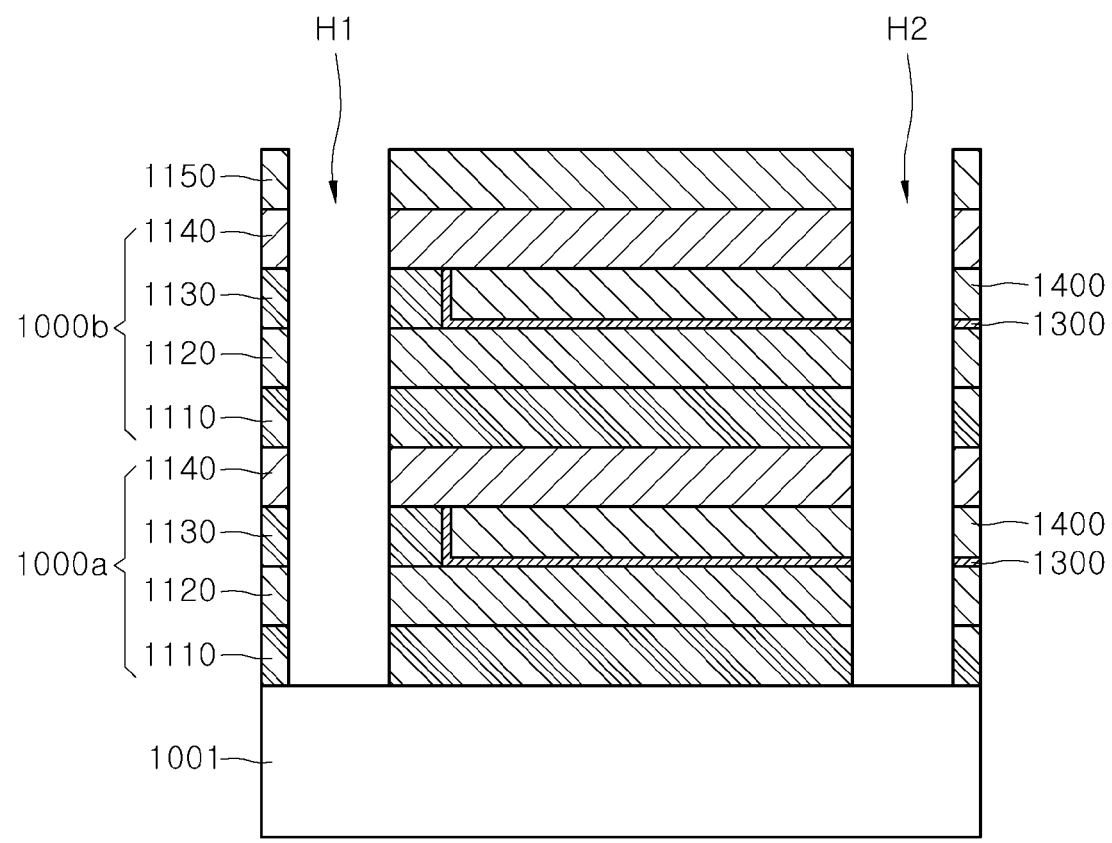

Referring to FIG. 13, a non-ferroelectric layer 1300 and a floating electrode layer 1400 may be formed in the first recess space R1. The non-ferroelectric layer 1300 and the floating electrode layer 1400 may be formed as follows.

First, the non-ferroelectric layer 1300 may be formed by oxidizing the surfaces of the semiconductor layer 1120 and the sacrificial layer 1130 through heat treatment in an oxygen atmosphere. In an embodiment, when the semiconductor layer 1120 is a doped silicon (Si) layer and the sacrificial layer 1130 is an un-doped silicon germanium (SiGe) layer, the non-ferroelectric layer 1300 may be a silicon oxide layer.

Then, the remaining portions of first recess space R1 and the first and second hole patterns H1 and H2 may be filled with a conductive material. The conductive material may include, for example, metal, conductive metal nitride, conductive metal oxide, or the like. The process of filling the first recess space R1 and the first and second hole patterns H1 and H2 with the conductive material may performed using, for example, a chemical vapor deposition method, or an atomic layer deposition method.

Then, any portion of the non-ferroelectric layer 1300 and the conductive material formed outside the first recess space R1 may be removed by applying an anisotropic etching method. Accordingly, the non-ferroelectric layer 1300 may be disposed on the semiconductor layer 1120 and the sacrificial layer 1130 in the first recess space R1, and the floating electrode layer 1400 may be formed on the non-ferroelectric layer 1300. The floating electrode layer 1400 may be formed from the conductive material. In addition, the floating electrode layer 1400 may be in contact with the second insulating layer 1140.

Figure 14:
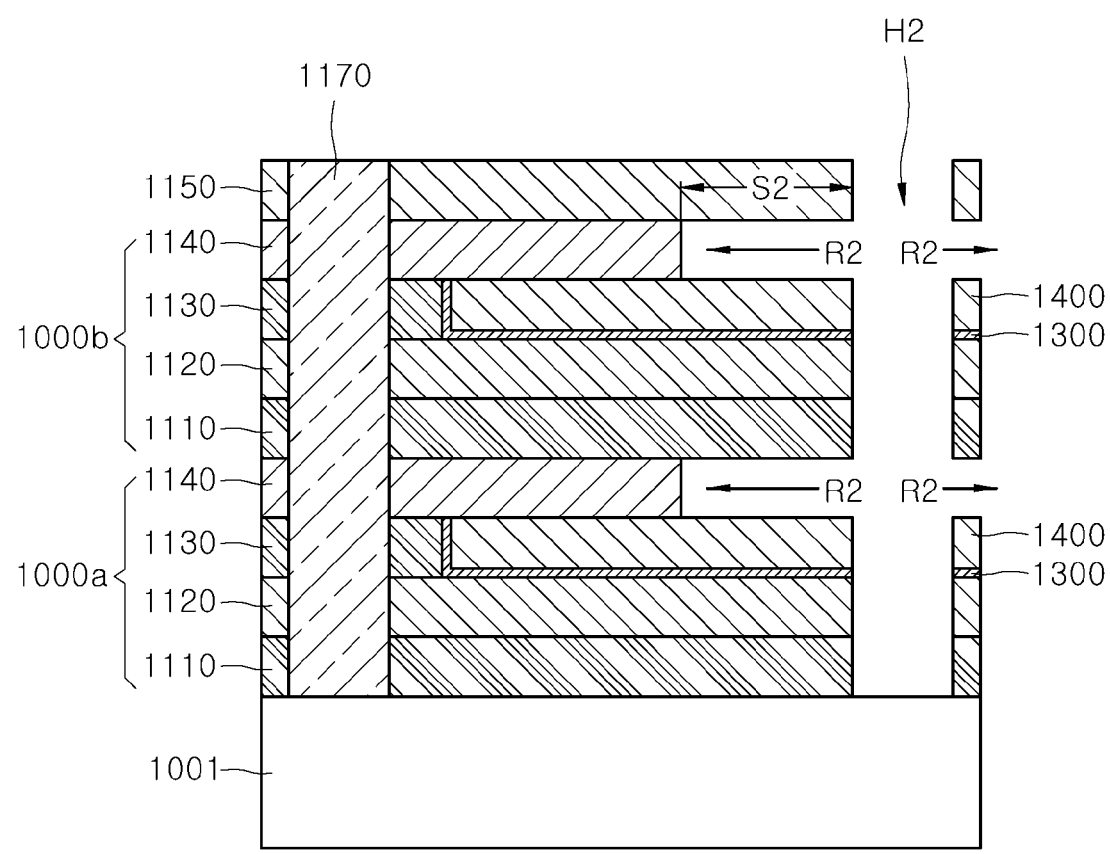

Referring to FIG. 14, a second passivation layer 1170 may be formed to fill the first hole pattern H1 on the substrate 1001, and a second etchant may be provided into the second hole pattern H2 to selectively etch the second insulating layer 1140. Through the etch process, the second insulating layer 1140 may be partially removed and a second recess space R2 may be formed to extend partway into the second insulating layer 1140. The second recess space R2 may have a second recess width S2 along a direction (e.g., the x-direction) on a plane (i.e., the x-y plane) that is substantially parallel to the surface of the substrate 1001. The second recess width S2 may be formed to be smaller than the first recess width S1.

Unlike the second insulating layer 1140, the first insulating layer 1110, the semiconductor layer 1120, the capping insulating layer 1150, the non-ferroelectric layer 1300, the floating electrode layer 1400, and the second passivation layer 1170 may have etch resistance with respect to the second etchant. The second passivation layer 1170 may include, for example, oxide, nitride, oxynitride, or a combination thereof. As another example, the second passivation layer 1170 may include a polymer such as a photosensitive resist material. After the second recess space R2 is formed, the second passivation layer 1170 may be removed.

Figure 15:
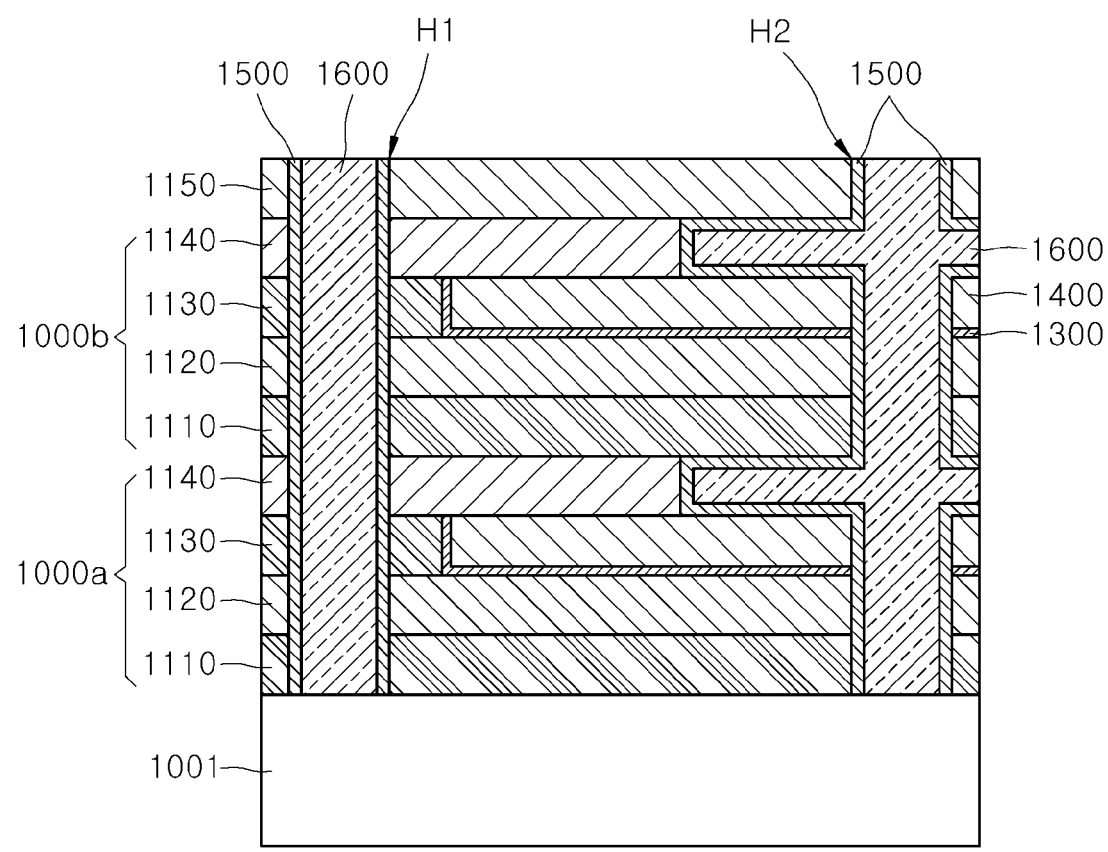

Referring to FIG. 15, a ferroelectric layer 1500 may be formed in the first and second hole patterns H1 and H2 and the second recess space R2. The ferroelectric layer 1500 may be formed on the sidewalls of the first and second hole patterns H1 and H2 and on the inner wall surface of the second recess space R2. The ferroelectric layer 1500 may be in contact with the floating electrode layer 1400.

Next, a conductive layer 1600 may be formed on the ferroelectric layer 1500. The conductive layer 1600 may be formed by filling the first and second hole patterns H1 and H2 and the second recess space R2, in which the ferroelectric layer 1500 is formed, with a conductive material. The conductive material may include, for example, metal, conductive metal nitride, conductive metal oxide, or the like. The process of filling the first and second hole patterns H1 and H2 and the second recess space R2 with the conductive material may be performed applying, for example, a chemical vapor deposition method, or an atomic layer deposition method.

Figure 16:
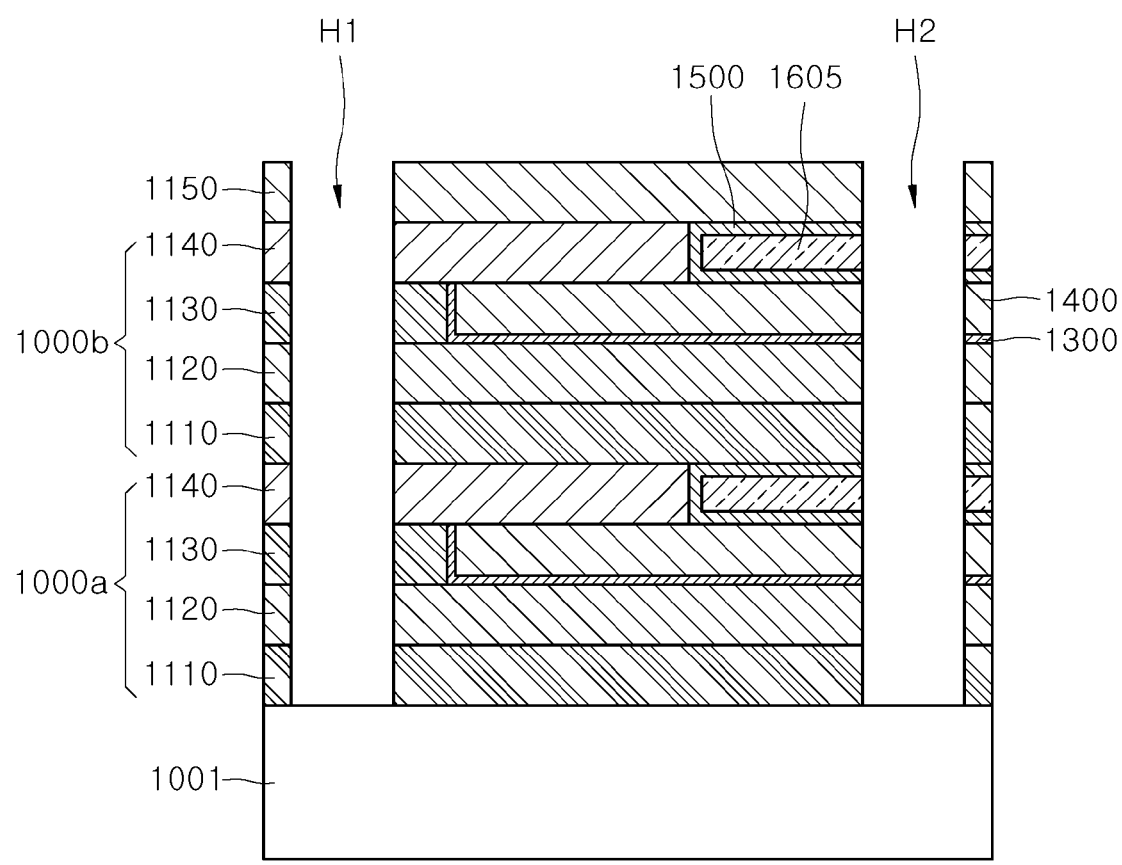

Referring to FIG. 16, any portion of the ferroelectric layer 1500 and the conductive layer 1600 formed outside the second recess space R2 may be removed by applying an anisotropic etching method. As a result, in the first stack structure 1000a, the ferroelectric layer 1500 may be disposed on the floating electrode layer 1400, the second insulating layer 1140, and the first insulating layer 1110 of the second stack structure 1000b, and a first electrode layer 1605 may be formed on the ferroelectric layer 1500, inside the second recess space R2. The first electrode layer 1605 may be formed from the removal of conductive layer 1600 from first and second hole patterns H1 and H2 through the anisotropic etching method.

Figure 17:
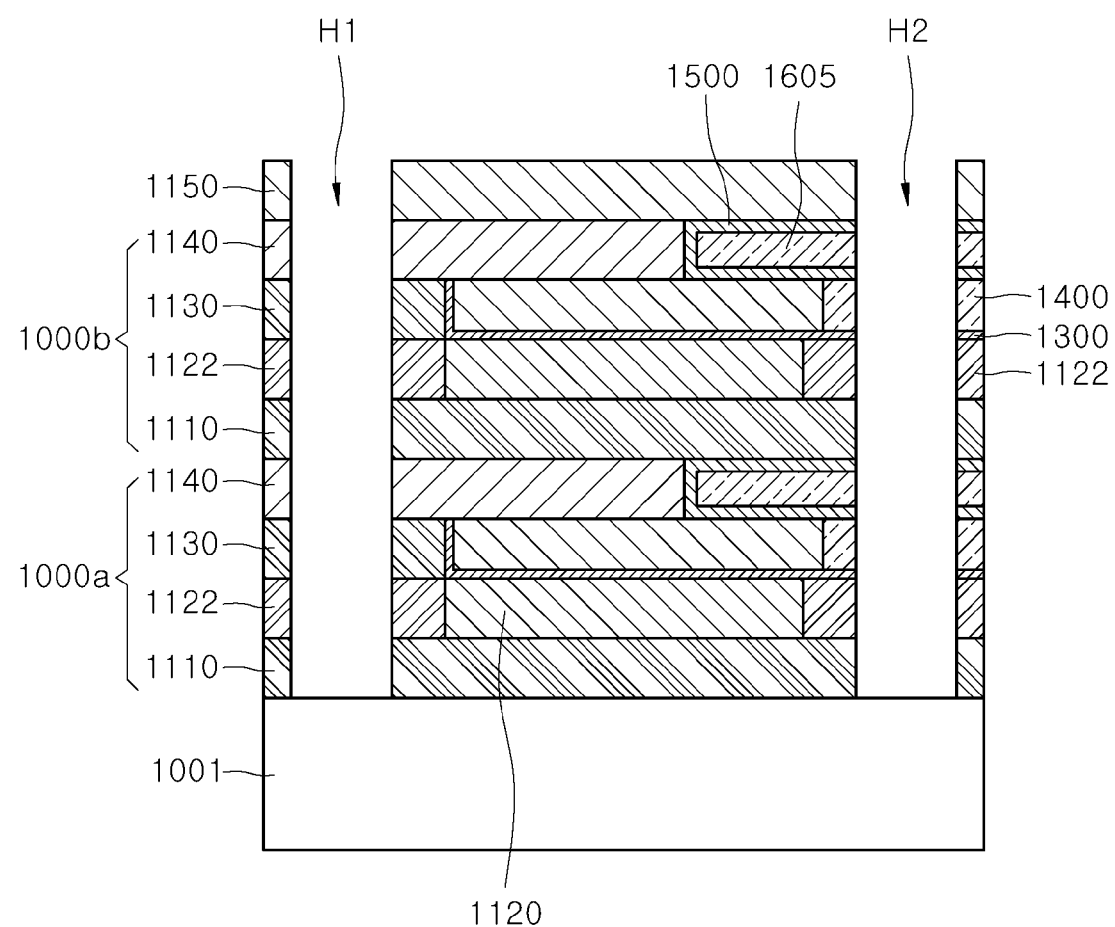

Referring to FIG. 17, the semiconductor layer 1120 exposed in the first and second hole patterns H1 and H2 may be doped to form a semiconductor doped region 1122. In an embodiment, the semiconductor doped region 1122 may be formed by providing a doping gas including a dopant into the first and second holes H1 and H2, and heat-treating the semiconductor layer 1120 in the doping gas atmosphere to diffuse the dopant into the semiconductor layer 1120. In another embodiment, the semiconductor layer 1120 may be doped by implanting a dopant into the semiconductor layer 1120 inside the first and second hole patterns H1 and H2 through an ion implantation method.

Figure 18:
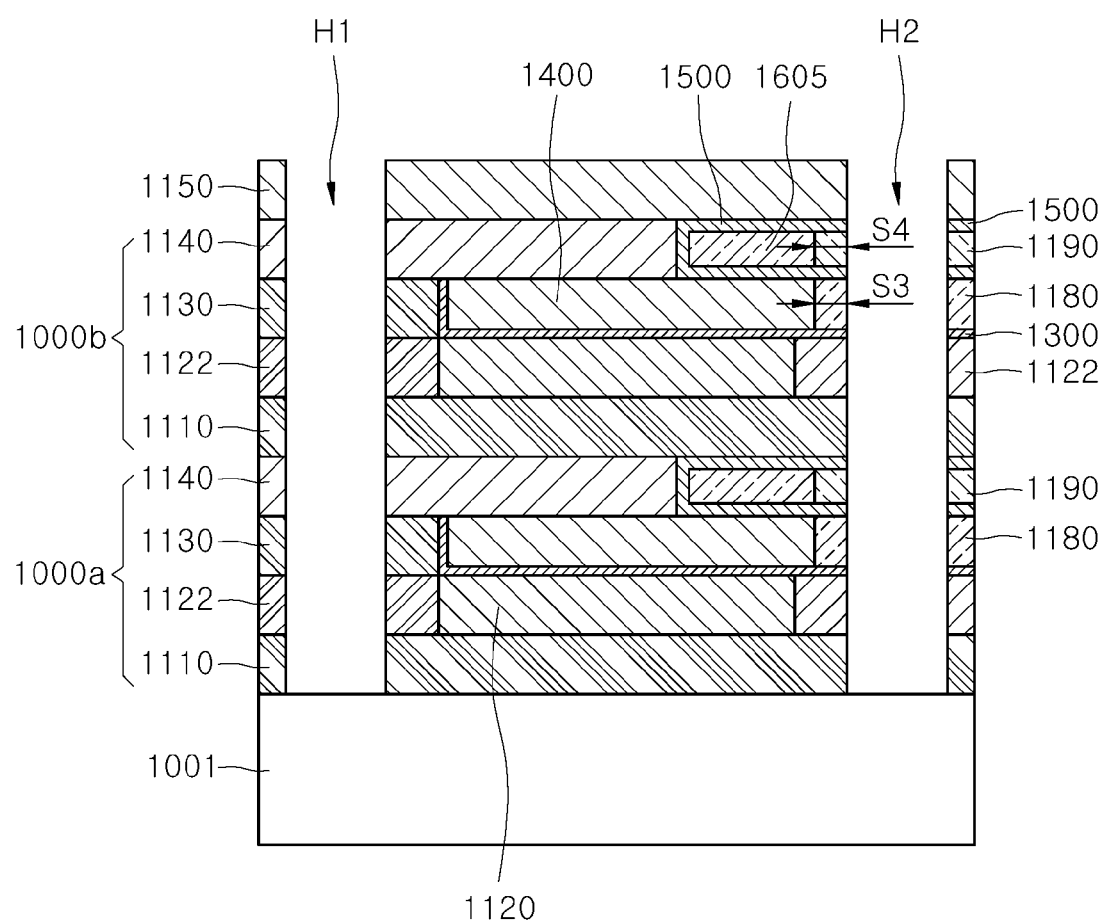

Referring to FIG. 18, the floating electrode layer 1400 and the first electrode layer 1605 exposed in the first and second hole patterns H1 and H2 may be selectively etched by an etch process. The etch process may be performed as a process of selectively etching the floating electrode layer 1400 and the first electrode layer 1605 to form third and fourth recess spaces (not illustrated). The third and fourth recess spaces may have third and fourth recess widths S3 and S4, respectively, along a direction (e.g., the x-direction) on a plane (i.e., the x-y plane) that is substantially parallel to the surface of the substrate 1001. The etch process may be performed by applying an isotropic etch method.

Subsequently, the third and fourth recess spaces may be filled with an insulating material to form first and second separation layers 1180 and 1190. The insulating material may include, for example, oxide, nitride, oxynitride, or a combination thereof. The third and fourth recess spaces may be filled with the insulating material through, for example, a chemical vapor deposition method, an atomic layer deposition method, or the like.

Figure 19:
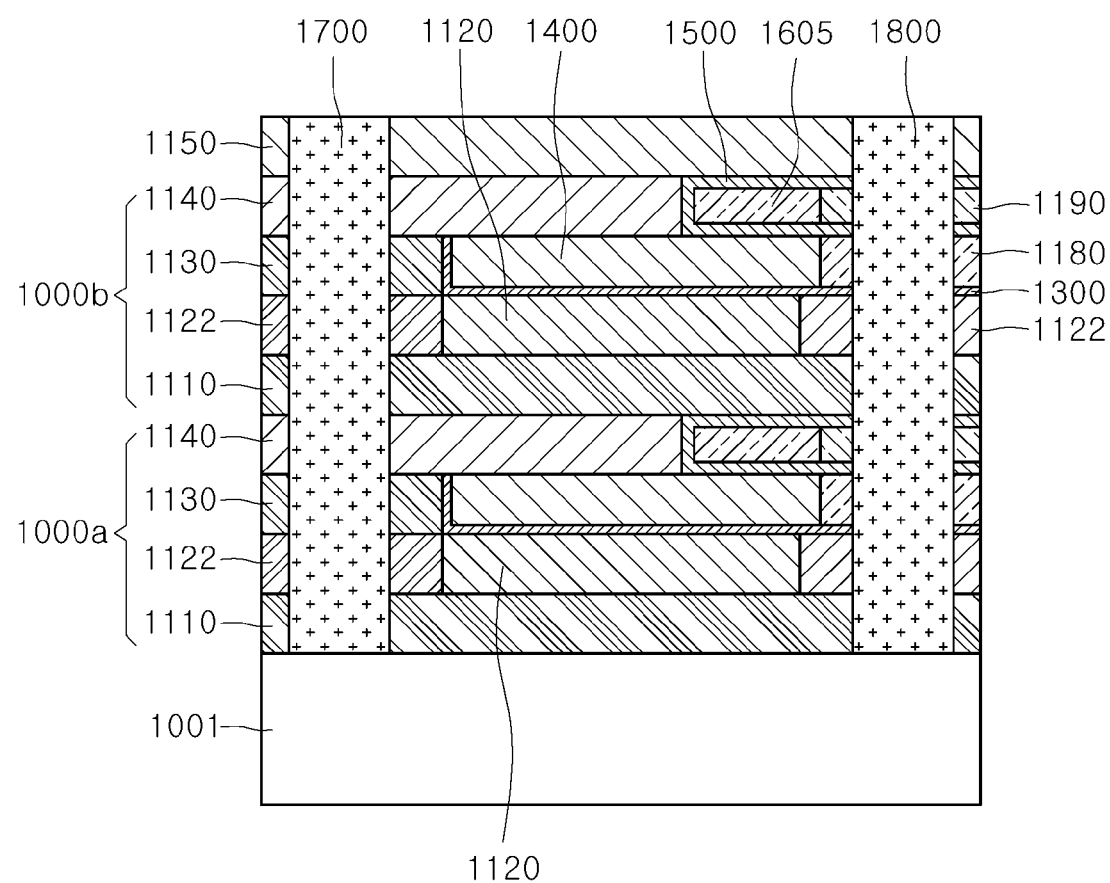

Referring to FIG. 19, the first and second hole patterns (H1 and H2 of FIG. 18) may be filled with a conductive material to form second and third electrode layers 1700 and 1800, respectively. The conductive material may include, for example, metal, conductive metal nitride, conductive metal oxide, or the like. The first and second hole patterns H1 and H2 may be filled with the conductive material by applying, for example, a chemical vapor deposition method, or an atomic layer deposition method. The second and third electrode layers 1700 and 1800 may be electrically connected to the semiconductor doped region 1122.

Through the above-described method, semiconductor devices according to embodiments of the present disclosure may be manufactured.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
   a substrate;
   a bit line and a source line extending in a vertical direction that is substantially perpendicular to a surface of the substrate;
   a semiconductor layer disposed between the source line and the bit line on a plane that is substantially parallel to the surface of the substrate;
   a non-ferroelectric layer pattern disposed on the semiconductor layer;
   a floating electrode layer pattern disposed on the non-ferroelectric layer pattern;
   a ferroelectric layer pattern disposed on the floating electrode layer pattern; and
   a word line disposed on the ferroelectric layer pattern,
   wherein an overlap area between the floating electrode layer pattern and the non-ferroelectric layer pattern in the vertical direction is greater than an overlap area between the ferroelectric layer pattern and the word line in the vertical direction.

2. The semiconductor device of claim 1, wherein the word line extends in a direction that is substantially parallel to the surface of the substrate.

3. The semiconductor device of claim 1, wherein the word line is disposed to overlap with a portion of the floating electrode layer pattern in the vertical direction.

4. The semiconductor device of claim 1, wherein each of the bit line and the source line includes a conductive pillar structure.

5. The semiconductor device of claim 1, wherein the semiconductor layer includes:
   a first doped region in contact with the bit line;
   a second doped region in contact with the source line; and
   a channel region disposed between the first doped region and the second doped region.

6. The semiconductor device of claim 1, wherein the non-ferroelectric layer pattern has a smaller dielectric constant than the ferroelectric layer pattern.

7. The semiconductor device of claim 1,
   wherein the floating electrode layer pattern is disposed to be spaced apart from the source line and the bit line, and
   wherein the non-ferroelectric layer pattern is disposed to be in contact with one of the source line and the bit line.

8. The semiconductor device of claim 1, wherein the ferroelectric layer pattern is disposed to surround at least a portion of the word line.

9. The semiconductor device of claim 1, wherein the ferroelectric layer pattern is disposed to contact one of the source line and the bit line.

10. A semiconductor device comprising:
    a substrate;
    a bit line and a source line extending in a vertical direction substantially perpendicular to a surface of the substrate; and
    a plurality of unit cell structures electrically connected to the bit line and the source line,
    wherein each of the plurality of unit cell structures includes:
    a semiconductor layer disposed on a plane that is substantially parallel to the surface of the substrate;
    a non-ferroelectric layer pattern disposed on the semiconductor layer;
    a floating electrode layer pattern disposed on the non-ferroelectric layer pattern;
    a ferroelectric layer pattern disposed on the floating electrode layer pattern; and
    a word line disposed on the ferroelectric layer pattern,
    wherein an overlap area between the floating electrode layer pattern and the non-ferroelectric layer pattern in the vertical direction is larger than an overlap area between the ferroelectric layer pattern and the word line in the vertical direction.

11. The semiconductor device of claim 10, wherein the plurality of unit cell structures are disposed in the vertical direction.

12. The semiconductor device of claim 10, wherein each of the source line and the bit line includes a conductive pillar structure.

13. The semiconductor device of claim 10, wherein the word line is disposed to overlap with a portion of the floating electrode layer pattern in the vertical direction.

14. The semiconductor device of claim 10, wherein the semiconductor layer includes:
    a first doped region in contact with the bit line;
    a second doped region in contact with the source line; and
    a channel region disposed between the first doped region and the second doped region.

15. The semiconductor device of claim 10, wherein the non-ferroelectric layer pattern has a smaller dielectric constant than the ferroelectric layer pattern.

16. A method of manufacturing a semiconductor device, the method comprising:
    forming a stack structure including a first insulating layer, a semiconductor layer, a sacrificial layer, and a second insulating layer that are sequentially stacked over a substrate;
    forming first and second hole patterns penetrating the stack structure over the substrate;
    forming a first recess space extending into the sacrificial layer from one hole pattern of the first and second hole patterns over the substrate;
    forming a non-ferroelectric layer and a floating electrode layer in the first recess space;
    forming a second recess space extending into the second insulating layer from the one hole pattern over the substrate, the second recess space being formed to have a smaller recess width than the first recess space;
    forming a ferroelectric layer and a first electrode layer in the second recess space; and forming second and third electrode layers that are disposed in the first and second hole patterns, respectively, and electrically connected to the semiconductor layer.

17. The method of claim 16, wherein the first insulating layer, the semiconductor layer, the sacrificial layer, and the second insulating layer have an etch selectivity with respect to each other.

18. The method of claim 16, wherein in forming the first recess space, an etchant is provided into the one hole pattern to selectively etch the sacrificial layer and to partially remove the sacrificial layer using the etchant.

19. The method of claim 16, wherein forming the non-ferroelectric layer and the floating electrode layer includes:
forming the non-ferroelectric layer on the semiconductor layer and the sacrificial layer exposed in the first recess space; and
filling the remainder of the first recess space with a conductive material to form the floating electrode layer.

20. The method of claim 16,
wherein the sacrificial layer includes a semiconductor material, and
wherein forming the non-ferroelectric layer in the first recess space includes oxidizing the semiconductor layer and the sacrificial layer exposed in the first recess space to form a semiconductor oxide layer.

21. The method of claim 16, wherein forming the second recess space includes providing an etchant in the one hole pattern to selectively etch the second insulating layer, and wherein the selective etch partially exposes the floating electrode layer.

22. The method of claim 16, wherein forming the ferroelectric layer and the first electrode layer in the second recess space includes:
forming the ferroelectric layer on an inner wall surface of the second recess space; and
filling the remaining second recess space in which the ferroelectric layer is formed with a conductive material to form the first electrode layer.

23. The method of claim 16, wherein forming the ferroelectric layer in the second recess space includes forming the ferroelectric layer to be in contact with the floating electrode layer.

24. The method of claim 16, further comprising doping the semiconductor layer exposed in the first and second hole patterns to form semiconductor doped regions.

25. The method of claim 16, wherein forming the second and third electrode layers includes:
partially etching the floating electrode layer and the first electrode layer exposed in the one hole pattern to form third and fourth recess spaces;
filling the third and fourth recess spaces with an insulating material to form first and second separation layers; and
filling the first and second hole patterns with a conductive material to form the second and third electrode layers, respectively.

* * * * *